(12) United States Patent
Kong et al.

(10) Patent No.: US 10,734,333 B2
(45) Date of Patent: Aug. 4, 2020

(54) SEMICONDUCTOR PACKAGE HAVING INDUCTIVE LATERAL INTERCONNECTS

(71) Applicant: Intel Corporation, Santa Clara, CA (US)

(72) Inventors: Jackson Chung Peng Kong, Tanjung Tokong (MY); Bok Eng Cheah, Bukit Gambir (MY); Khang Choong Yong, Puchong (MY); Howard Lincoln Heck, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/093,828

(22) PCT Filed: Jun. 15, 2016

(86) PCT No.: PCT/US2016/037709
§ 371 (c)(1),
(2) Date: Oct. 15, 2018

(87) PCT Pub. No.: WO2017/217986
PCT Pub. Date: Dec. 21, 2017

(65) Prior Publication Data
US 2019/0131257 A1    May 2, 2019

(51) Int. Cl.
*H01L 23/42* (2006.01)
*H01L 23/52* (2006.01)
(Continued)

(52) U.S. Cl.
CPC ............ *H01L 23/66* (2013.01); *H01L 21/486* (2013.01); *H01L 23/49822* (2013.01);
(Continued)

(58) Field of Classification Search
CPC ..... H01L 2224/48091; H01L 21/67028; H01L 2223/6616; H01L 2224/48227; H01L 23/49827
(Continued)

(56) References Cited

U.S. PATENT DOCUMENTS 9,159,625 B1 * 10/2015 Lee ................... H01L 21/7806
2008/0203580 A1 * 8/2008 Lee ....................... H01L 23/585
257/775

(Continued)

FOREIGN PATENT DOCUMENTS

KR    10-2012-0050828    5/2012

OTHER PUBLICATIONS

International Search Report and Written Opinion for International Patent Application No. PCT/US2016/037709 dated Feb. 28, 2017, 9 pgs.

(Continued)

*Primary Examiner* — S. V. Clark
(74) *Attorney, Agent, or Firm* — Schwabe, Williamson & Wyatt, P.C.

(57) ABSTRACT

Semiconductor packages including a lateral interconnect having an arc segment to increase self-inductance of a signal line is described. In an example, the lateral interconnect includes a circular segment extending around an interconnect pad. The circular segment may extend around a vertical axis of a vertical interconnect to introduce an inductive circuitry to compensate for an impedance mismatch of the vertical interconnect.

20 Claims, 8 Drawing Sheets

(51) Int. Cl.
  *H01L 29/40* (2006.01)
  *H01L 23/66* (2006.01)
  *H01L 23/498* (2006.01)
  *H01L 23/525* (2006.01)
  *H01L 21/48* (2006.01)
  *H01L 23/64* (2006.01)
  *H01L 23/31* (2006.01)

(52) U.S. Cl.
  CPC .. *H01L 23/49833* (2013.01); *H01L 23/49838* (2013.01); *H01L 23/525* (2013.01); *H01L 23/3128* (2013.01); *H01L 23/49816* (2013.01); *H01L 23/49827* (2013.01); *H01L 23/645* (2013.01); *H01L 2223/6616* (2013.01); *H01L 2223/6638* (2013.01); *H01L 2223/6672* (2013.01); *H01L 2224/48091* (2013.01); *H01L 2224/48227* (2013.01); *H01L 2224/73265* (2013.01); *H01L 2924/15311* (2013.01)

(58) Field of Classification Search
  USPC ........ 257/678, 690, 698, 784; 438/106, 108, 438/125
  See application file for complete search history.

(56) References Cited

U.S. PATENT DOCUMENTS

| | | |
|---|---|---|
| 2011/0031598 A1 | 2/2011 | Lee et al. |
| 2011/0317387 A1 | 12/2011 | Pan et al. |
| 2014/0183639 A1* | 7/2014 | Ma ................ H01L 23/60 257/356 |
| 2014/0191404 A1* | 7/2014 | Wang ............ H01L 23/5386 257/773 |
| 2014/0252544 A1 | 9/2014 | Li et al. |
| 2015/0214173 A1 | 7/2015 | Wen |
| 2018/0190711 A1* | 7/2018 | Perzlmaier ........ H01L 33/62 |
| 2019/0181080 A1* | 6/2019 | Cheah ............ H01L 23/49811 |

OTHER PUBLICATIONS

International Preliminary Search Report for International Patent Application No. PCT/US2016/037709, dated Dec. 27, 2018, 6 pages.

* cited by examiner

SEMICONDUCTOR PACKAGE HAVING INDUCTIVE LATERAL INTERCONNECTS

CROSS-REFERENCE TO RELATED APPLICATION

This patent application is a U.S. National Phase Application under 35 U.S.C. § 371 of International Application No. PCT/US2016/037709, filed Jun. 15, 2016, entitled "SEMICONDUCTOR PACKAGE HAVING INDUCTIVE LATERAL INTERCONNECTS," which designates the United States of America, the entire disclosure of which is hereby incorporated by reference in its entirety and for all purposes.

TECHNICAL FIELD

Embodiments are in the field of integrated circuit packages and, in particular, semiconductor packages including interconnect structures to match impedance of a signal line.

BACKGROUND

Hardware interfaces allow for data connections between, e.g., a computer and a peripheral device. A typical end-to-end application of hardware interfaces such as USB 3.1 or Thunderbolt includes a data connection between an integrated circuit in a computer, i.e., a host package, and an integrated circuit in a thumb drive, i.e., a device package. The data connection using such hardware interfaces may be a multi-Gbps differential high-speed input/output link. For example, the data connection may be 10 Gbps or more. In such high speed applications, signal integrity is fundamental to maintaining an effective data connection. Signal integrity, however, may be affected by impedance mismatch in a signal line of the data connection. More particularly, impedance mismatch in integrated circuit packages may degrade an efficacy of high speed links.

DESCRIPTION OF EMBODIMENTS

Semiconductor packages including lateral interconnects having arc segments to increase self-inductance of a signal line are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Impedance mismatch in a transmission channel of an integrated circuit package may be caused by an over-capacitive nature of a via (e.g., a plated through hole) structure. More particularly, an electric field from signals traveling through the via structure may cause parasitic capacitance between the via structure and a reference plane. As described in more detail below, such parasitic capacitance contributes to an impedance of the via structure, which differs from an impedance of other interconnect structures such as signal traces and/or microvias of the transmission channel The impedance mismatch has been shown to cause multi-reflection noise. Accordingly, aggressive "voiding" between the via pad structure and the adjacent reference plane has been used to reduce the parasitic capacitance. Voiding may include forming a dielectric buffer zone between the via pad structure and the adjacent reference plane, and thus, any improvement in impedance matching may come at the cost of increased package form factor and/or layer count.

In an aspect, an impedance of a vertical interconnect, e.g., a via structure, may be increased by incorporating a lateral interconnect having an arc segment extending around a vertical axis of the via structure or a pad on the via structure. More particularly, the lateral interconnect may introduce an inductive circuitry to compensate for impedance mismatch caused by an inherent parasitic capacitance of the via structure. That is, the lateral interconnect may increase a self-inductance of a signal line of a package substrate, and accordingly, a differential impedance of the signal line may be increased. Reflection noise in the signal line may decrease accordingly. As such, by compensating for a parasitic capacitance using introduced inductance (rather than voiding to affect the parasitic capacitance directly) electrical performance of the signal line may be enhanced without increasing package form factor and/or layer count.

Figure 1:
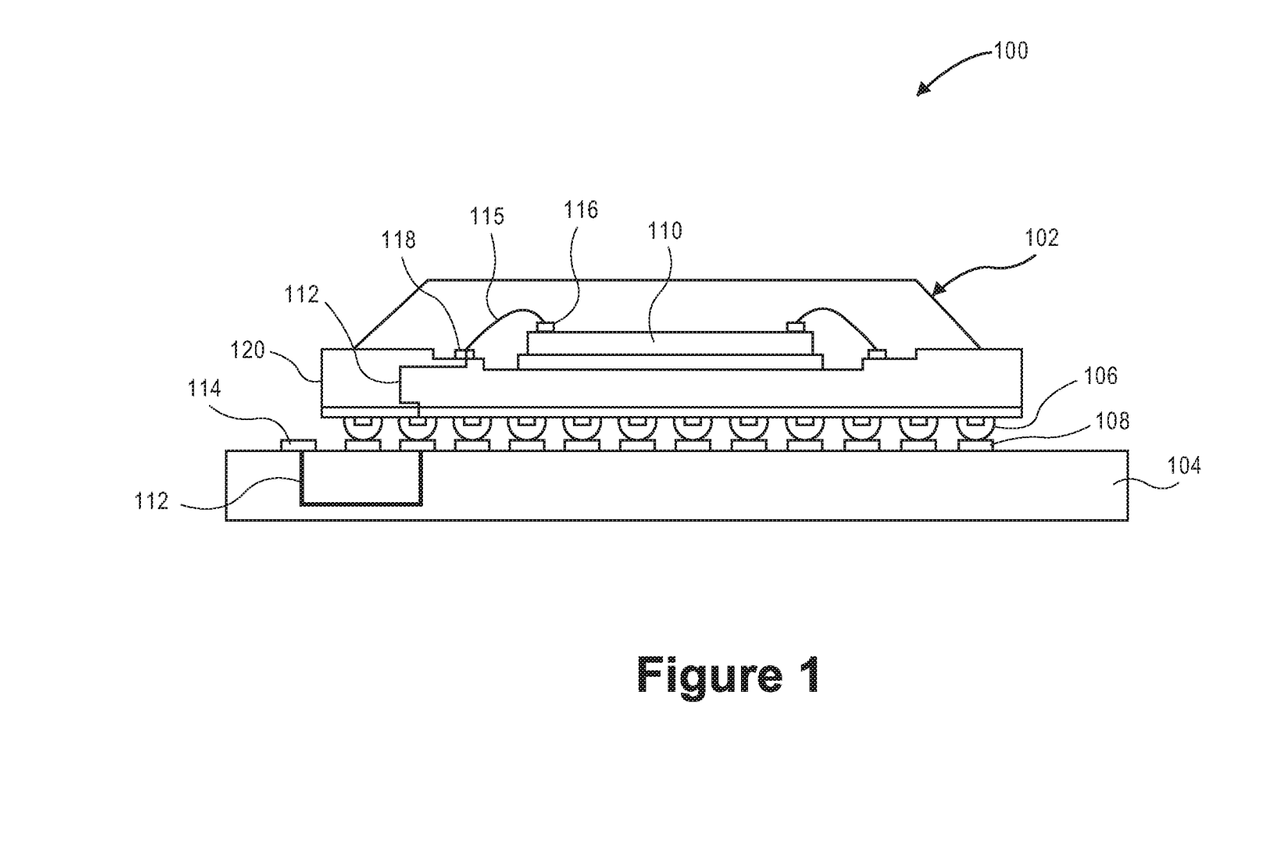
FIG. 1 illustrates a sectional view of a semiconductor package assembly, in accordance with an embodiment.

Referring to FIG. 1, a sectional view of a semiconductor package assembly is shown in accordance with an embodiment. A semiconductor package assembly 100 may include a semiconductor package 102 mounted on a circuit board 104. For example, semiconductor package 102 may be a ball grid array (BGA) component having several solder balls 106 arranged in a ball field, i.e., an array of solder balls 106 arranged in a grid or other pattern. Each solder ball 106 may be mounted and attached to a corresponding contact pad 108 of circuit board 104. Circuit board 104 may be a motherboard or another printed circuit board 104 of a computer system. Accordingly, the solder ball 106 and contact pad 108 attachment may provide a physical and electrical interface between an integrated circuit 110 of semiconductor package 102 and circuit board 104. More particularly, electrical signals may be communicated between integrated circuit 110 and circuit board 104, or peripheral devices connected to circuit board 104, through a signal line 112.

Signal line 112 may include various vertical and lateral electrical interconnect structures to carry an electrical signal from integrated circuit 110 to a peripheral connector 114 of circuit board 104. For example, semiconductor package 102 may be a wire bonding package, and include a lead 115 having ends soldered to a respective pin 116 or terminal of integrated circuit 110 and to a respective bonding pad 118 on a package substrate 120. In an embodiment, semiconductor package 102 is a non-wire bonding package, and includes terminal bumps, e.g., C4 bumps, connected to respective bonding pads 118 on package substrate 120. Accordingly, integrated circuit 110 may be mounted on package substrate 120 and/or signal line 112 may include an electrical connection between integrated circuit 110 and package substrate 120. Signal line 112 may also include an electrical connection between bonding pads 118 and peripheral connector 114 through package substrate 120 and circuit board 104.

Figure 2:
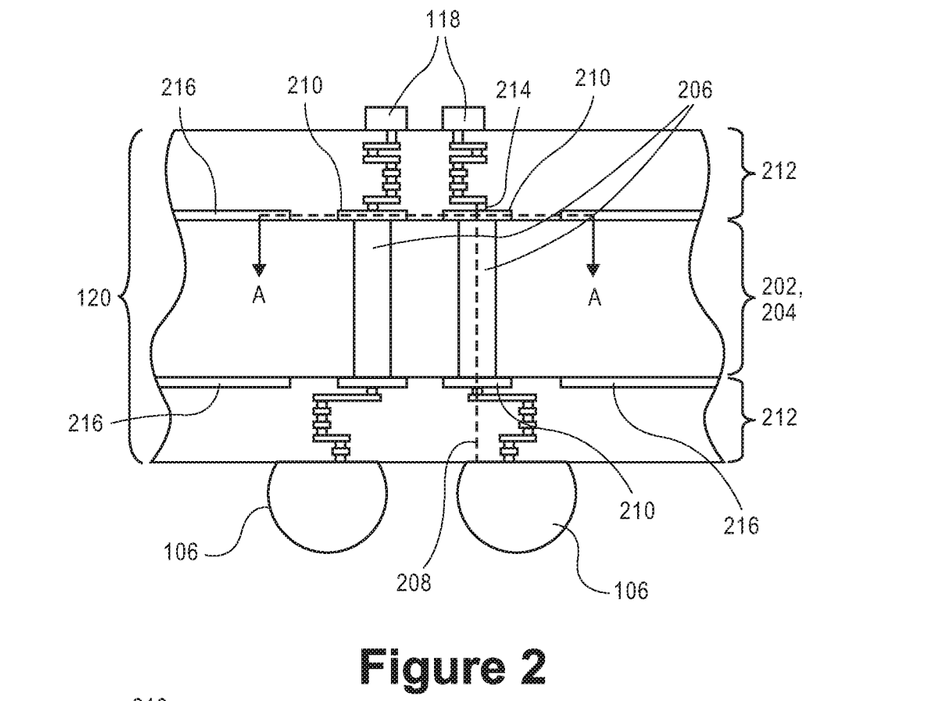
FIG. 2 illustrates a sectional view of a signal line of a semiconductor package, in accordance with an embodiment.

Referring to FIG. 2, a sectional view of a signal line of a semiconductor package is shown in accordance with an embodiment. Package substrate 120 of semiconductor package 102 may include signal line 112 between bonding pads 118 and solder balls 106, and signal line 112 may include several interconnect structures. For example, package substrate 120 may include a core region 202 having a dielectric layer 204, and one or more vertical interconnects 206 may extend through dielectric layer 204. More particularly, core region 202 may include a rigid core having an organic substrate layer. Vertical interconnects 206 in core region 202 may, for example, include a plated-through-hole extending along a vertical axis 208 between an interconnect pad 210 over dielectric layer 204 and a corresponding interconnect pad 210 below dielectric layer 204.

Signal line 112 of package substrate 120 may include additional electrical interconnects electrically connected to the plated-through-hole. For example, package substrate 120 may include one or more interconnect layer 212 having several axial and transverse interconnects (with respect to vertical axis 208). In an embodiment, a first interconnect layer 212 is located above dielectric layer 204 and includes axial and transverse interconnects extending between bonding pad 118 and interconnect pad 210 attached to an upper end of vertical interconnect 206 in dielectric layer 204. A second interconnect layer 212 may be located below dielectric layer 204 and may include axial and transverse interconnects extending between interconnect pad 210 attached to a lower end of vertical interconnect 206 in dielectric layer 204 and solder ball 106.

The axial interconnects in interconnect layer 212 may include additional vertical interconnects having a different dimension, e.g., height or diameter, than vertical interconnect 206 in dielectric layer 204. For example, a second vertical interconnect 214 in interconnect layer 212 may include a microvia. As such second vertical interconnect 214 may include a height and a diameter less than vertical interconnect 206. Furthermore, axial interconnects such as vertical interconnect 206 and second vertical interconnect 214 may be interconnected by transverse interconnects, as described below.

Interconnect layers 212 of package substrate 120 may include one or more reference plane 216. For example, reference plane 216 may be a metal sub-layer of interconnect layer 212 that is coplanar with interconnect pad 210. Reference plane 216, e.g., a ground or $V_{ss}$ reference plane, may have a different potential and/or polarity than vertical interconnect 206, interconnect pad 210, or solder ball 106, and thus, each of those signal line 112 components may develop a parasitic capacitance relative to reference plane 216 when an electrical signal is delivered through signal line 112. Furthermore, since the structures and relative locations of the signal line 112 components varies, the parasitic capacitance of the respective components may vary. As such, an impedance of the respective components shall vary proportionally. That is, the impedance may be generally described as being equal to the square root of a ratio of an inductance of the signal line component to a parasitic capacitance of the signal line component. As the parasitic capacitance increases, the impedance may tend to decrease. Accordingly, impedances of the signal line components may not be well-matched. For example, an impedance of a microvia in interconnect layer 212 may be higher than an impedance of a plated-through-hole in dielectric layer 204. As a result, an electrical signal passing through signal line 112 may experience variations in impedance that cause signal degradation.

Figure 3:
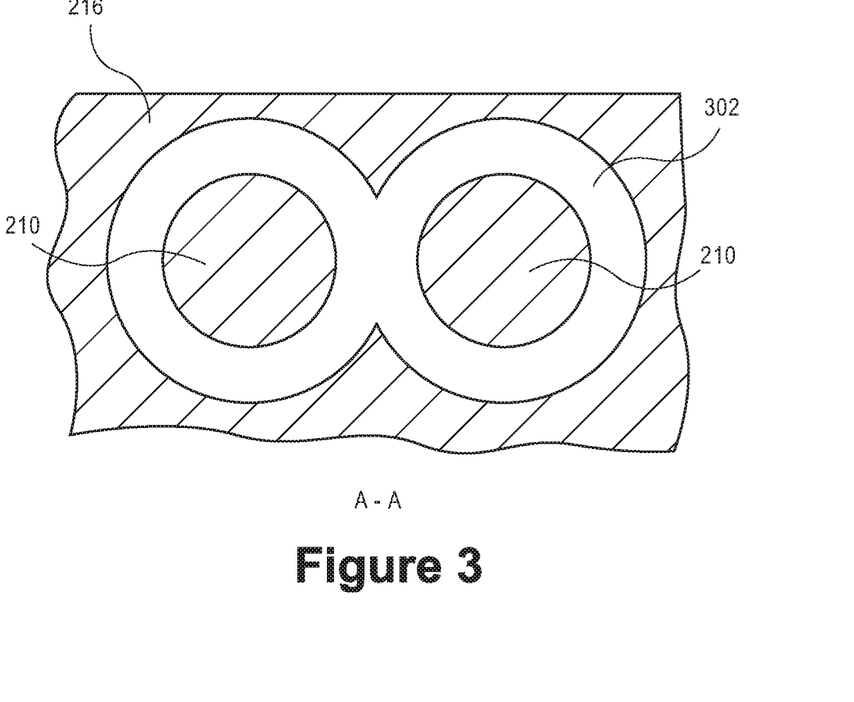
FIG. 3 illustrates a top view, taken about line A-A of FIG. 2, of voiding around a vertical interconnect of an integrated circuit package, in accordance with an embodiment.

Referring to FIG. 3, a top view, taken about line A-A of FIG. 2, of voiding around a vertical interconnect of an integrated circuit package is shown in accordance with an embodiment. Reference plane 216 may extend around one or more pads connected to respective vertical interconnects 206. For example, reference plane 216 may surround interconnect pad 210 at a top end of vertical interconnect 206 in dielectric layer 204. In an embodiment, voiding around signal line 112 includes a dielectric spacer 302 between reference plane 216 and interconnect pad 210. That is, a void may be formed between interconnect pad 210 and a reference plane 216 in an additive or subtractive process, and the void may be filled with a dielectric material. A void size, e.g., a lateral distance, between interconnect pad 210 and a reference plane 216 may affect the parasitic capacitance of interconnect pad 210 and/or vertical interconnect 206. For example, increasing the void size may decrease the parasitic capacitance of vertical interconnect 206 and result in a corresponding increase in the impedance of vertical interconnect 206. Increasing the void dimension, however, may sub-optimally increase a footprint of signal line 112. As described below, rather than, or in addition to, altering the parasitic capacitance of signal line 112 using voiding, the structure of signal line 112 may be formed to induce electrical inductance that compensates for the parasitic capacitance of the signal line components and thereby changes the impedance of the signal line components.

Figure 4:
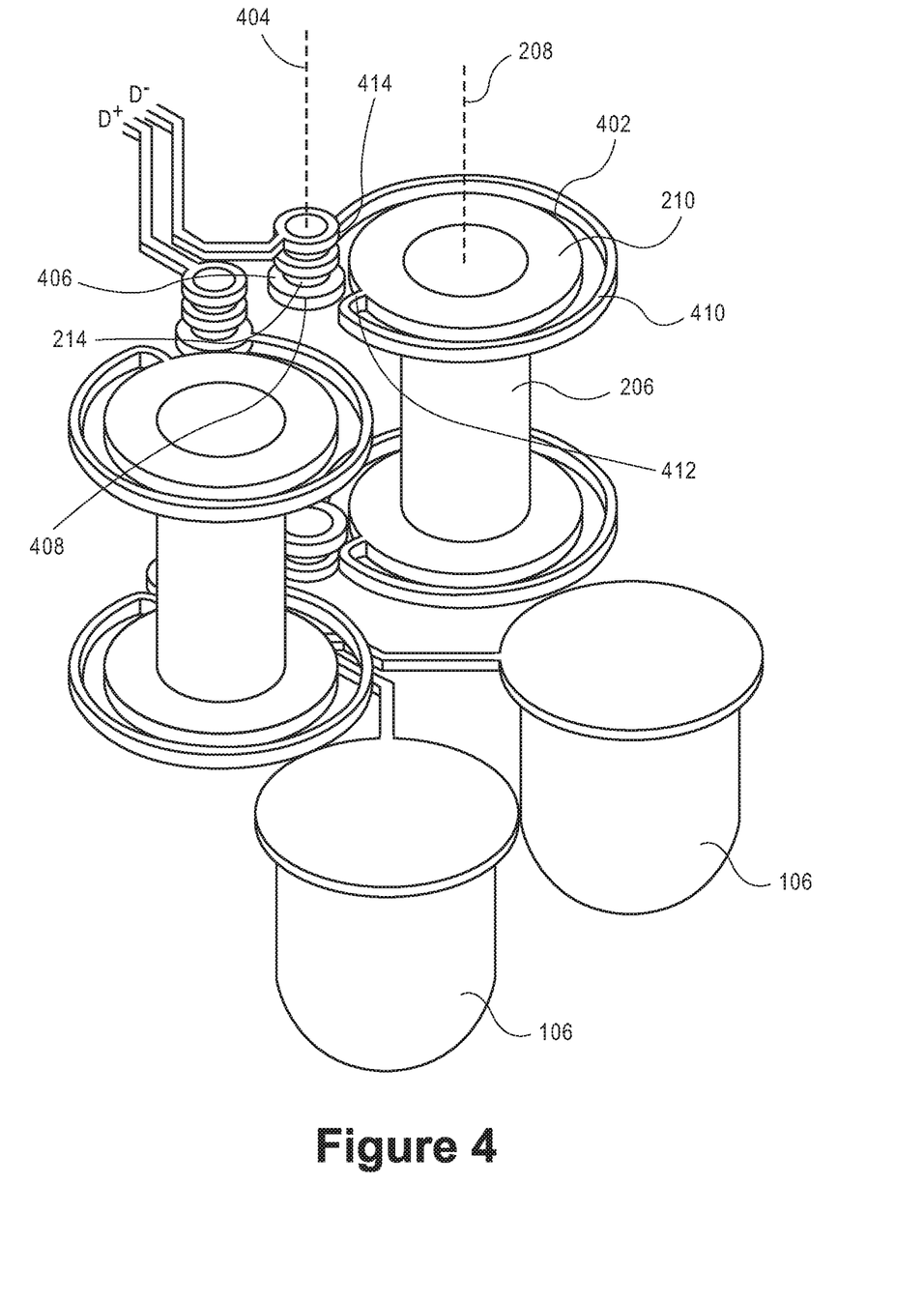
FIG. 4 illustrates a perspective view of a vertical interconnect region of an integrated circuit package having a lateral interconnect including an arc segment, in accordance with an embodiment.

Referring to FIG. 4, a perspective view of a vertical interconnect region of an integrated circuit package having a lateral interconnect including an arc segment is shown in accordance with an embodiment. Signal line 112 is shown without surrounding structures such as reference plane 216 or dielectric layer 204 to facilitate a visual understanding of how signal line 112 is constructed. In an embodiment, interconnect pad 210 includes a pad perimeter 402 around vertical axis 208. Pad perimeter 402 may be circular, for example, in the case of a disk shaped interconnect pad 210 over dielectric layer 204 surrounding vertical interconnect 206.

Signal line 112 may include second vertical interconnect 214 spaced apart from vertical interconnect 206. That is, a second vertical axis 404 passing through second vertical interconnect 214 may be laterally offset from vertical axis 208 by a separation distance. Second vertical interconnect 214 may extend along second vertical axis 404 from a second interconnect pad 406. For example, second interconnect pad 406 may be coplanar, e.g., within a same horizontal conductive plane of interconnect layer 212, with interconnect pad 210. Furthermore, second interconnect pad 406 may include a second pad perimeter 408 around second vertical axis 404. Thus, second pad perimeter 408 may be laterally offset from pad perimeter 402 within interconnected layer above or below dielectric layer 204.

Vertical interconnect 206 and second vertical interconnect 214 of signal line 112 may be electrically connected by a lateral interconnect 410. For example, lateral interconnect 410 may extend laterally from interconnect pad 210 and second interconnect pad 406. That is, lateral interconnect 410 may extend from a first end 412 at pad perimeter 402 to a second end 414 (hidden behind second vertical interconnect 214) at second pad perimeter 408. Thus, integrated circuit 110 may be electrically connected to vertical interconnect 206 through signal line 112, which includes lateral interconnect 410 between interconnect pad 210 and second interconnect pad 406.

Lateral interconnect 410 may increase an impedance of vertical interconnect 206 to better match an impedance of second vertical interconnect 214 and/or other components of the transmission channel More particularly, lateral interconnect 410 may extend around a portion of interconnect pad 210, creating an inductive circuitry to generate inductance that compensates for the parasitic capacitance a vertical interconnect 206. That is, given that the impedance of signal line 112 is directly proportional to the signal line 112 inductance, the inductive circuitry of lateral interconnect 410 extending around interconnect pad 210 may increase the impedance of vertical interconnect 206 to better match the impedance of adjacent signal line 112 structures.

Figure 5:
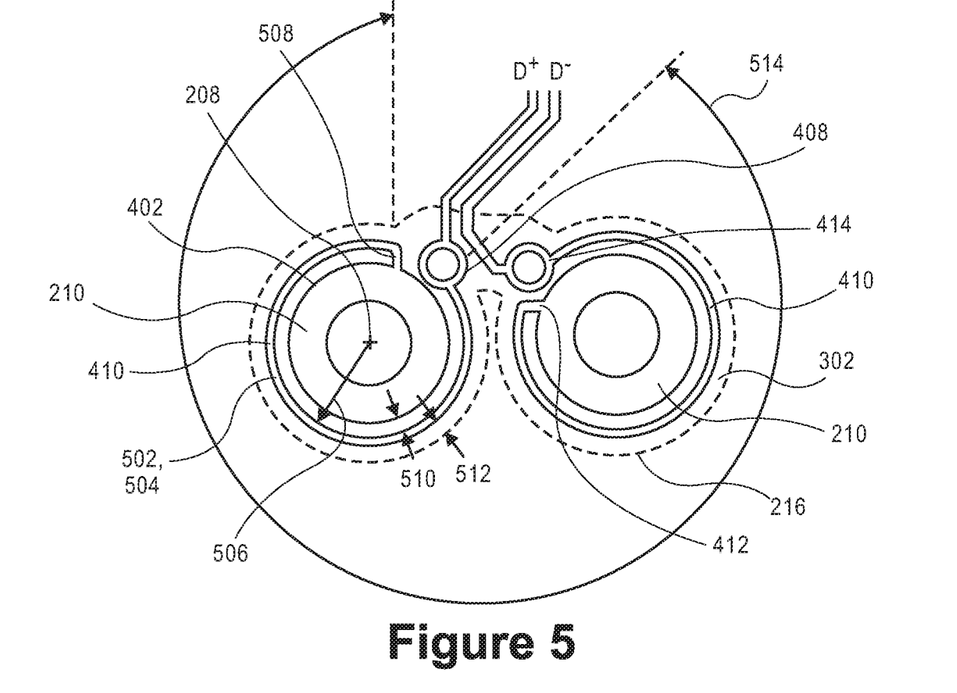
FIG. 5 illustrates a top view of a vertical interconnect region of an integrated circuit package having a lateral interconnect including an arc segment, in accordance with an embodiment.

Referring to FIG. 5, a top view of a vertical interconnect region of an integrated circuit package having a lateral interconnect including an arc segment is shown in accordance with an embodiment. A pair of signal lines 112 having similar inductive circuitry are shown to illustrate that lateral interconnects 410 may be implemented in differential signal lines 112, which are typically used in high speed links. For example, a pair of signal lines 112 having respective lateral interconnects 410 may carry respective electrical signals (shown as D+ and D−) that reference to each other to determine a transmitted data level. Lateral interconnect 410 encircling at least a portion of vertical interconnect 206 and/or interconnect pad 210 may, however, be implemented in a single wire application, e.g., a power bus application. Accordingly, the impedance matching structure described herein is not restricted to a particular signal line type.

Lateral interconnect 410 may include an arc segment 502 extending around interconnect pad 210. That is, arc segment 502 may curve around an angular portion of pad perimeter 402 about vertical axis 208. The curved routing of arc segment 502 may increase inductance of signal line 112 in the vertical interconnect 206 region.

In an embodiment, arc segment 502 includes a circular segment 504 extending around pad perimeter 402 at a radius 506 from vertical axis 208. More particularly, lateral interconnect 410 may include a radial segment 508 extending radially from pad perimeter 402. Radial segment 508 may have a length equal to radius 506 minus a diameter of pad perimeter 402. Similarly, second interconnect pad 406 and/or second pad perimeter 408 may be laterally offset from pad perimeter 402, e.g., by a distance equal to a length of radial segment 508. Accordingly, circular segment 504 may extend from radial segment 508 to second pad perimeter 408 at a constant, or nearly constant, distance from vertical axis 208.

An edge of reference plane 216 is indicated by a dashed line in FIG. 5. Accordingly, reference plane 216 may surround interconnect pad 210 and second interconnect pad 406, having an edge that encompasses the pair of signal lines 112. As such, dielectric spacer 302 may include a dielectric material filling a void between the interconnect pads 210 and the edge of reference plane 216. In an embodiment, lateral interconnect 410 extends through dielectric spacer 302 between pad perimeter 402 and second pad perimeter 408. When lateral interconnect 410 includes circular segment 504, a first distance 510 between pad perimeter 402 and an inner edge of circular segment 504 may be equal to a second distance 512 between an outer edge of circular segment 504 and reference plane 216. In other words, circular segment 504 may be located within dielectric spacer 302 equidistant from pad perimeter 402 and reference plane 216.

Arc segment 502 of lateral interconnect 410 may have an arc length 514 surrounding an angular portion of interconnect pad 210. More particularly, arc length 514 may subtend an angle taken about vertical axis 208. The angle may be equal to, less than, or more than, 360°. For example, arc length 514 may subtend an angle less than one revolution around interconnect pad 210, as shown in FIG. 5.

Figure 6:
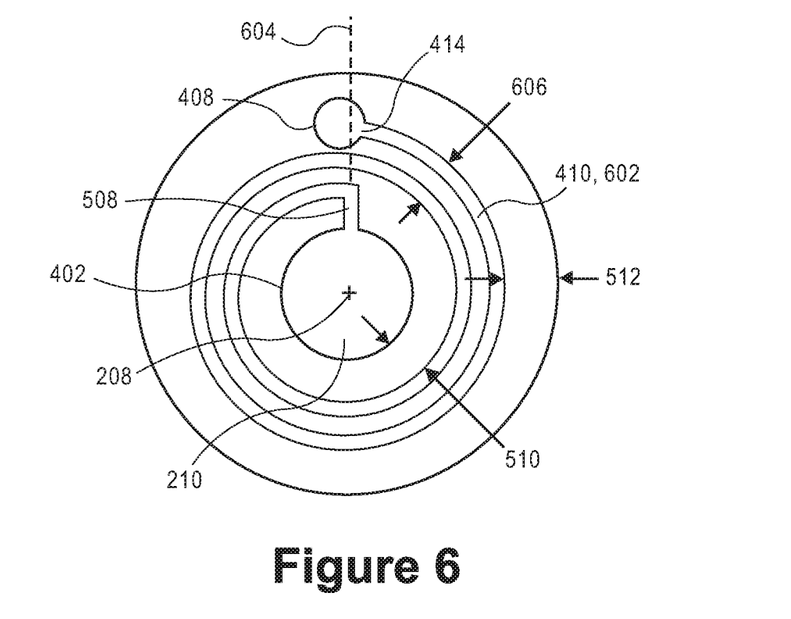
FIG. 6 illustrates a top view of a vertical interconnect region of an integrated circuit package having a lateral interconnect including a spiral segment, in accordance with an embodiment.

Referring to FIG. 6, a top view of a vertical interconnect region of an integrated circuit package having a lateral interconnect including a spiral segment is shown in accordance with an embodiment. Arc length 514 of arc segment 502 may subtend an angle equal to or greater than one revolution around interconnect pad 210. In an embodiment, lateral interconnect 410 includes a spiral segment 602 between pad perimeter 402 and second pad perimeter 408. Spiral segment 602 may include several revolutions around vertical axis 208. For example, spiral segment 602 may include a first end at radial segment 508 of lateral interconnect 410 and may spiral around vertical axis 208 to a second end 414 at second pad perimeter 408. Radial segment 508 may extend radially from pad perimeter 402 along a radial plane 604 through which vertical axis 208 passes. Accordingly, the first end 412 of spiral segment 602 may be radially spaced apart from pad perimeter 402. Spiral segment 602 may, however, extend directly from pad perimeter 402. That is, the first end 412 of spiral segment 602 may be located at pad perimeter 402 and spiral segment 602 may spiral around vertical axis 208 to the second end 414 at second pad perimeter 408.

Spiral segment 602 may be located in a middle of dielectric spacer 302 between pad perimeter 402 and reference plane 216. For example, first distance 510 between pad perimeter 402 and an inner edge of spiral segment 602 may be in a range of 10-15 microns and second distance 512 between an outer edge of spiral segment 602 and reference plane 216 may be in a range of 10-15 microns. In an embodiment, first distance 510 is equal to second distance 512.

A cross-sectional dimension of lateral interconnect 410 may be uniform or may vary along an arc length 514. For example, lateral interconnect 410 may include an interconnect width in a range of 10-15 microns, and an interconnect height in a range of 15-25 microns. In a case of lateral interconnect 410 having several turns around vertical axis 208 and pad perimeter 402, the interconnect width may be measured from an inner edge of an innermost turn to an outer edge of an outermost turn, i.e., an arc width 606 as shown in FIG. 6. By way of example, the interconnect width may be in a range of 15-45 microns and the interconnect height may be 20 microns over a majority of arc length 514.

Although the structure having interconnect pad 210, lateral interconnect 410, and second interconnect pad 406 have been described in relation to a single layer of package substrate 120, it will be appreciated that a similar structure may be used at various locations of package substrate 120. More particularly, as shown above in FIG. 4, lateral interconnect 410 may be incorporated at both a top end and a bottom end of vertical interconnect 206 to connect corresponding interconnect pads 210 to laterally offset microvias 214.

Figure 7:
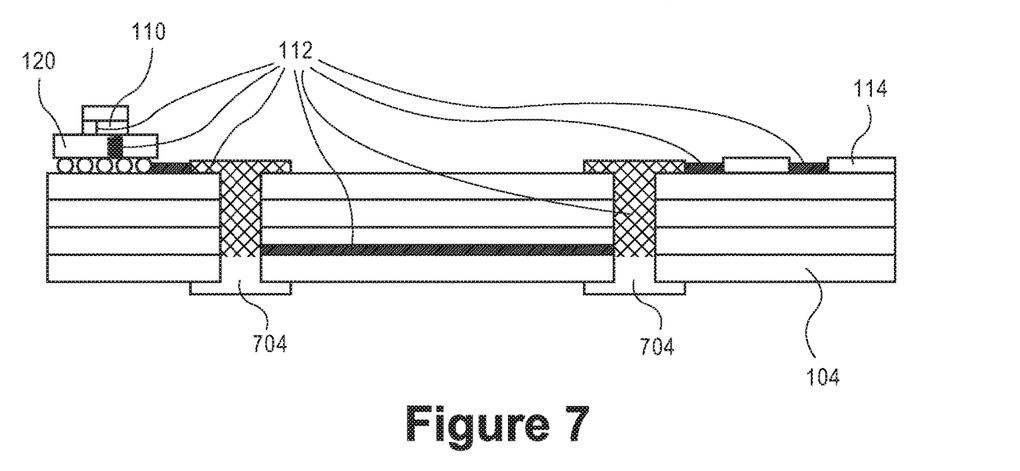
FIG. 7 illustrates a schematic view of a semiconductor package assembly having a semiconductor package mounted on a circuit board, in accordance with an embodiment.

Referring to FIG. 7, a schematic view of a semiconductor package assembly having a semiconductor package mounted on a circuit board is shown in accordance with an embodiment. Lateral interconnect structures may also be implemented in semiconductor package assembly 100 components other than package substrate 120. For example, semiconductor package assembly 100 may include signal line 112 extending between integrated circuit 110 of semiconductor package 120 and a connector 114, e.g., a USB plug or receptacle. The USB plug or receptacle may be used to connect to a peripheral device, for example, a thumb drive or an external USB cable tethered to an external hard disk drive. Thus, signal line 112 may carry an electrical signal through integrated circuit 110, package substrate 120, circuit board 104, and connector 114. Lateral interconnect 410 may be located at any position along signal line 112 to generate inductance when an electrical signal passes through vertical interconnect 206. For example, lateral interconnect 410 having arc segment 502 may be implemented within integrated circuit 110. Within integrated circuit 110, lateral interconnect 410 may extend around a through-silicon-via passing vertically through a silicon layer of the die.

Lateral interconnect 410 structure may also be implemented within circuit board 104. For example, circuit board 104 may include a plated-through-hole or via 704 passing vertically through one or more layers of circuit board 104. Via 704 may be analogous to, and may be referred to as, vertical interconnect 206 as described above. Similarly, conductive pads of circuit board 104 may be analogous to, and may be referred to as, interconnect pad 210 as described above. Accordingly, lateral interconnect 410 having arc segment 502 may extend laterally from interconnect pad 210, e.g., the conductive pad of circuit board 104, around a vertical axis 208 passing through vertical interconnect 206, e.g., the plated-through-hole of circuit board 104. Thus, lateral interconnect 410 may apply to both the package level and the board level of semiconductor package assembly 100, and may be implemented in one or more components of semiconductor package 120 or circuit board 104. One skilled in the art will understand that other features of lateral interconnect 410 as described above may be incorporated in a portion of signal line 112 within integrated circuit 110 or circuit board 104, and thus, such embodiments are not described here for the sake of brevity.

Regardless of a location along signal line 112, lateral interconnect 410 having an arcuate structure as described above may provide a similar improvement in electrical performance Electrically, lateral interconnect 410 having arc segment 502 generates additional self-inductance in signal line 112. More particularly, when an electrical signal travels through vertical interconnect 206 of signal line 112, signal line 112 itself may have an inductance. Vertical interconnect 206 may exhibit a first self-inductance. Similarly, when the electrical signal travels through lateral interconnect 410 adjacent to vertical interconnect 206, lateral interconnect 410 may exhibit a second self-inductance. In an embodiment, the second self-inductance may be at least twice the first self-inductance. Accordingly, an overall self-inductance of signal line 112 may increase by a margin proportional to the second self-inductance as compared to a signal line 112 not having a lateral interconnect 410.

Signal line 112 may also exhibit a mutual inductance between the differential electrical signals (i.e., D+ and D−). In an embodiment, the mutual inductance of signal line 112 may decrease as a result of incorporating lateral interconnect 410 into the conductive line.

Experiments have indicated that self-inductance of signal line 112 may increase by more than 200%, e.g., a three times increase or more, when signal line 112 incorporates lateral interconnect 410 having an arcuate structure. Experiments have indicated that mutual inductance may be reduced by more than 50% when signal line 112 incorporates lateral interconnect 410 having an arcuate structure. Experiments have also indicated that parasitic capacitance of signal line 112 may increase by a slight increment, e.g., on the order of 0.1 pF, when signal line 112 incorporates lateral interconnect 410 having an arcuate structure. The increase in self-inductance and decrease in mutual inductance of signal line 112, however, more than offsets the increase in parasitic capacitance of signal line 112. Accordingly, an overall impedance of vertical interconnect 206 of signal line 112, or a differential impedance between two signal lines 112 in the region of vertical interconnect 206 of signal line 112, has been shown to increase when signal line 112 incorporates lateral interconnect 410 having an arcuate structure.

Figure 8:
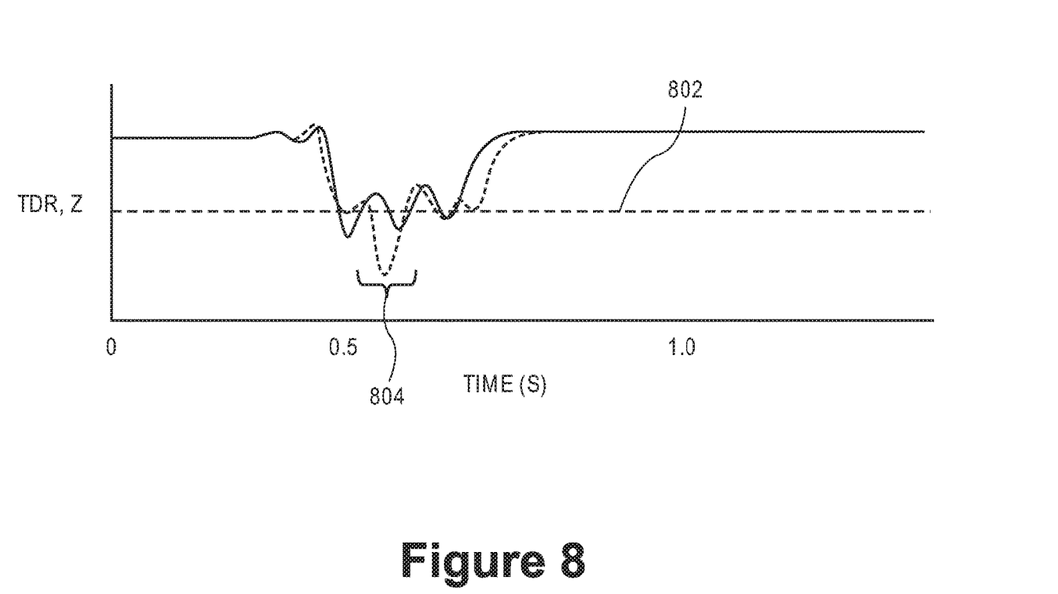
FIG. 8 illustrates a time-domain reflectometry plot of a signal line having a lateral interconnect including an arc segment extending from a vertical interconnect, in accordance with an embodiment.

Referring to FIG. 8, a time-domain reflectometry (TDR) plot of a signal line having a lateral interconnect including an arc segment extending from a vertical interconnect is shown in accordance with an embodiment. An increase in impedance of the via structure caused by the lateral interconnect 410 may better match the rest of the transmission channel. Accordingly, multi-reflection noise caused by impedance mismatch in the channel may be mitigated. This is shown in the TDR plot.

The TDR plot compares signal line 112 having the lateral interconnect 410 (solid line) to a signal line 112 not having lateral interconnect 410 (dashed line). The TDR plot shows an impedance discontinuity between pins 116, e.g., C4 bumps, of integrated circuit 110 to solder balls 106, e.g., BGA connections of package substrate 120, for each of the comparison signal line structures. A target impedance 802 for signal line 112 may be constant, e.g., 80 ohms throughout the signal line 112. More particularly, any deviation from target impedance 802 may cause impedance mismatch in signal line 112, and thus, is undesirable. In each of the non-ideal cases, i.e., the actual signal line 112 structures, impedance does deviate from target impedance 802. For example, in a plated-through-hole (PTH) region, signal line 112 not having lateral interconnect 410 may exhibit a differential impedance of 25% or more below target impedance 802, e.g., less than 60 ohms. Signal line 112 having lateral interconnect 410, however, may match target impedance 802 better. For example, a differential impedance in PTH region 804 of signal line 112 having lateral interconnect 410 may be less than 25% below target impedance 802, e.g., 70 ohms. That is, impedance mismatch usually associated with vertical interconnect 206 may be reduced by lateral interconnect 410 having arc segment 502.

Figure 9:
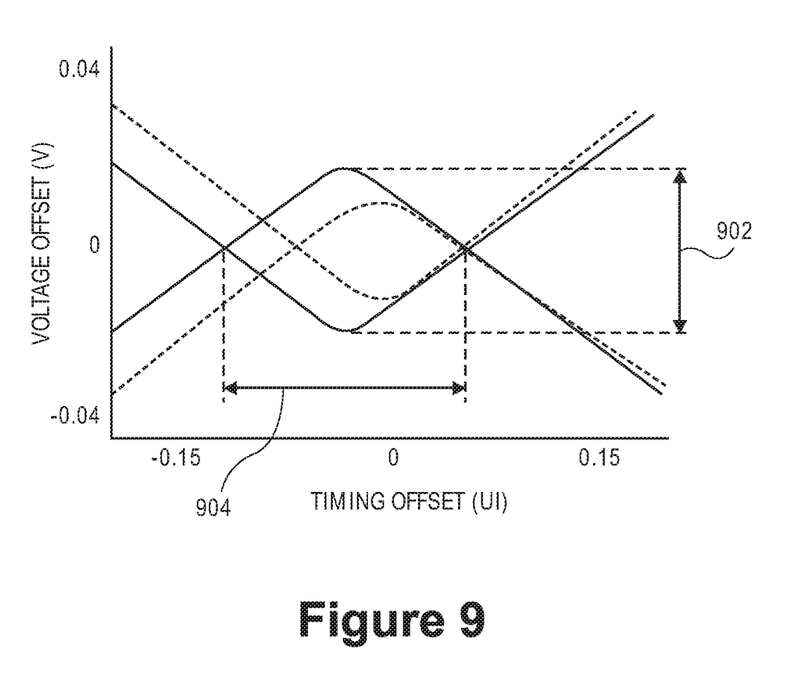
FIG. 9 illustrates an eye diagram representing an electrical performance of a signal line having a lateral interconnect including an arc segment extending from a vertical interconnect, in accordance with an embodiment.

Referring to FIG. 9, an eye diagram representing an electrical performance of a signal line having a lateral interconnect including an arc segment extending from a vertical interconnect is shown in accordance with an embodiment. Impedance mismatch is a key source of reflection noise in a high-speed I/O channel, and thus, reduced impedance mismatch translates to an improvement in eye margin. Impedance mismatch affects a signal amplitude at a receiving end of signal line 112. The resulting signal integrity can be represented by the eye diagram. Essentially, the larger the eye opening, i.e., the diamond-shaped space bounded between the data traces, the more easily a bit or sequence of bits may be distinguished. Thus, the eye diagram indicates a quality of signal and an efficacy of a high-speed I/O channel.

The eye diagram compares signal line 112 having lateral interconnect 410 (solid line) to a signal line 112 not having lateral interconnect 410 (dashed line). It is readily apparent that signal line 112 having lateral interconnect 410 generates a larger eye opening than signal line 112 not having lateral interconnect 410. For example, experiments have shown that an eye height 902 of signal line 112 having lateral interconnect 410 represents an improvement of more than 20%, e.g., a 10 mV improvement, as compared to a corresponding eye height 902 of signal line 112 not having lateral interconnect 410. Similarly, experiments have shown that an eye width 904 of signal line 112 having lateral interconnect 410 may increase by 3-4 ps as compared to a corresponding eye width 904 of signal line 112 not having lateral interconnect 410. Thus, lateral interconnect 410 having arc segment 502 enhances a signal integrity of signal line 112.

Figure 10:
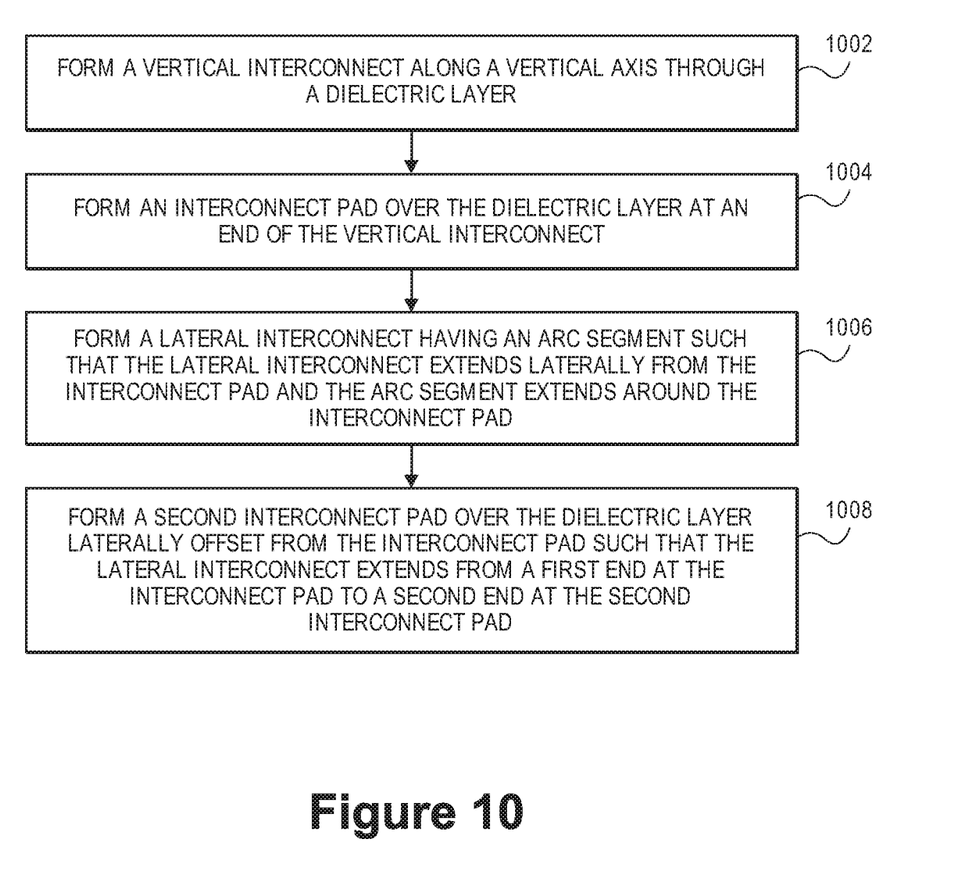
FIG. 10 illustrates a method of fabricating a semiconductor package substrate including a lateral interconnect having an arc segment extending from a vertical interconnect, in accordance with an embodiment.

Referring to FIG. 10, a method of fabricating a semiconductor package substrate including a lateral interconnect having an arc segment extending from a vertical interconnect is shown in accordance with an embodiment. The method may be performed using known processing techniques to form a signal line structure having a lateral interconnect as described above.

At operation 1002, vertical interconnect 206 may be formed along vertical axis 208 through dielectric layer 204. For example, a hole may be laser-drilled in dielectric layer 204, and a conductive material such as copper may be deposited into the hole to form vertical interconnect 206.

At operation 1004, an interconnect pad 210 may be formed over dielectric layer 204 at an end of vertical interconnect 206. For example, interconnect pad 210 may be formed in an additive or subtractive process as a part of a conductive interconnect layer 212 of package substrate 120. Interconnect pad 210 may include pad perimeter 402 around vertical axis 208. Furthermore, pad perimeter 402 may be separated from another portion of interconnect layer 212 by dielectric spacer 302. In an embodiment, dielectric spacer 302 may also surround vertical interconnect 206. Thus, the method may include filling a void around vertical interconnect 206 and/or interconnect pad 210 with a dielectric material to form dielectric spacer 302.

At operation 1006, a lateral interconnect 410 may be formed to electrically connect with interconnect pad 210. More particularly, lateral interconnect 410 may extend laterally from interconnect pad 210 over dielectric layer 204. Lateral interconnect 410 may include arc segment 502 extending around interconnect pad 210 about vertical axis 208, as described above. In an embodiment, lateral interconnect 410 may be deposited in the anti-pad area, i.e., within dielectric spacer 302. The routing may be formed in an additive process. For example, the routing may be formed using an electroplating process to deposit conductive material into a void formed within dielectric spacer 302. Alternatively, routing may be formed in a subtractive process, by removing conductive material from interconnect layer 212 to form lateral interconnect 410.

At operation 1008, second interconnect pad 406 may be formed over dielectric layer 204. As described above, second interconnect pad 406 may include second pad perimeter 408 around second vertical axis 404, and second vertical axis 404 may be laterally offset from vertical axis 208. Thus, second interconnect pad 406 may be laterally offset from interconnect pad 210. Accordingly, lateral interconnect 410 may extend from a first end 412 at interconnect pad 210 to a second end 414 at second interconnect pad 406. The formation of second interconnect pad 406 may involve similar processes as described above, e.g., additive or subtractive processes. Accordingly, signal line 112 may be constructed to include a pair of vertical interconnects 206 electrically connected by a lateral interconnect 410 having an arc segment 502.

Figure 11:
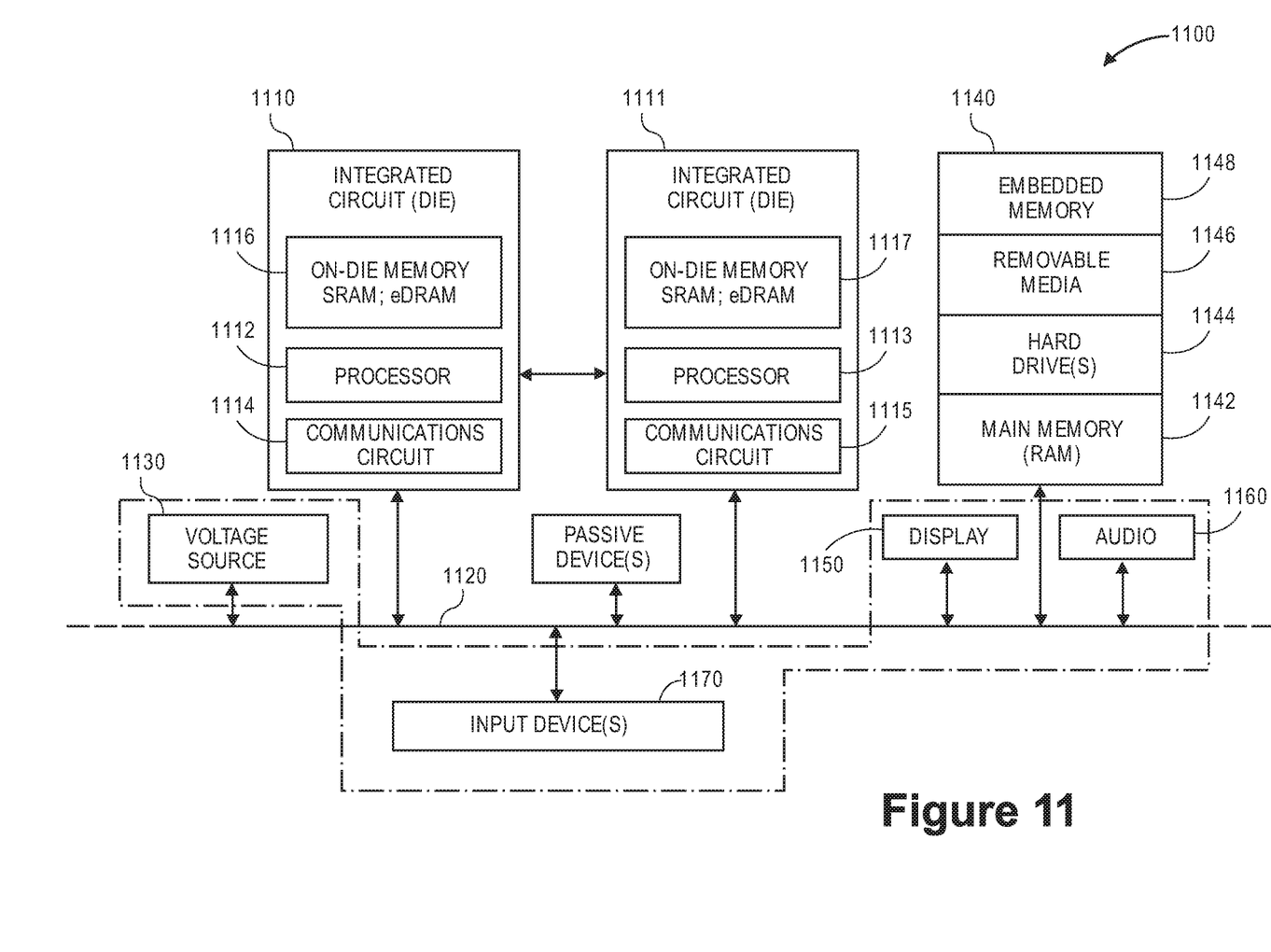
FIG. 11 is a schematic of a computer system, in accordance with an embodiment.

FIG. 11 is a schematic of a computer system, in accordance with an embodiment. The computer system 1100 (also referred to as the electronic system 1100) as depicted can embody a semiconductor package including lateral interconnects having an arc segment to increase self-inductance of a signal line, according to any of the several disclosed embodiments and their equivalents as set forth in this disclosure. The computer system 1100 may be a mobile device such as a netbook computer. The computer system 1100 may be a mobile device such as a wireless smart phone. The computer system 1100 may be a desktop computer. The computer system 1100 may be a hand-held reader. The computer system 1100 may be a server system. The computer system 1100 may be a supercomputer or high-performance computing system.

In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 includes, or is coupled with, a semiconductor package including lateral interconnects having an arc segment to increase self-inductance of a signal line, as disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1111 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as the first die in a die stack, according to an embodiment.

In an embodiment, the electronic system 1100 also includes a display device 1150, and an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including a semiconductor package including lateral interconnects having an arc segment to increase self-inductance of a signal line, according to any of the several disclosed embodiments and their equivalents, an electronic system, a computer system, one or more methods of fabricating an integrated circuit, and one or more methods of fabricating an electronic assembly that includes a semiconductor package including lateral interconnects having an arc segment to increase self-inductance of a signal line, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a semiconductor package including lateral interconnects having an arc segment to increase self-inductance of a signal line embodiments and their equivalents. A foundation substrate may be included, as represented by the dashed line of FIG. 11. Passive devices may also be included, as is also depicted in FIG. 11.

Embodiments of a semiconductor package including lateral interconnects having an arc segment to increase self-inductance of a signal line are described above. In an embodiment, a semiconductor package includes a package substrate including an interconnect pad having a pad perimeter around a vertical axis, a vertical interconnect extending from the interconnect pad along the vertical axis, and a lateral interconnect extending laterally from the interconnect pad. The lateral interconnect includes an arc segment extending around the interconnect pad about the vertical axis. The semiconductor package includes an integrated circuit mounted on the package substrate. The integrated circuit is electrically connected to the vertical interconnect through the interconnect pad and the lateral interconnect.

In one embodiment, the package substrate further includes a second interconnect pad having a second pad perimeter around a second vertical axis laterally offset from the vertical axis. The package substrate includes a second vertical interconnect extending along the second vertical axis from the second interconnect pad. The lateral interconnect extends from a first end at the pad perimeter to a second end at the second pad perimeter.

In one embodiment, the vertical interconnect includes a plated-through-hole. The second vertical interconnect includes a microvia.

In one embodiment, the package substrate further includes a reference plane around the interconnect pad and the second interconnect pad, and a dielectric spacer between the reference plane and the interconnect pads. The lateral interconnect extends through the dielectric spacer between the pad perimeter and the second pad perimeter.

In one embodiment, the lateral interconnect includes a radial segment extending radially from the pad perimeter, and a circular segment extending from the radial segment to the second pad perimeter around the pad perimeter at a radius from the vertical axis.

In one embodiment, a first distance between the pad perimeter and the circular segment is equal to a second distance between the circular segment and the reference plane.

In one embodiment, the lateral interconnect includes a spiral segment between the pad perimeter and the second pad perimeter.

In one embodiment, the spiral segment includes several revolutions around the vertical axis.

In one embodiment, a self-inductance of the lateral interconnect is at least twice a self-inductance of the vertical interconnect when an electrical signal travels through the vertical interconnect and the lateral interconnect.

In an embodiment, a semiconductor package assembly includes a circuit board having an interconnect pad having a pad perimeter around a vertical axis, a vertical interconnect extending from the interconnect pad along the vertical axis, and a lateral interconnect extending laterally from the interconnect pad. The lateral interconnect includes an arc segment extending around the interconnect pad about the vertical axis. The lateral interconnect includes a semiconductor package mounted on the circuit board. The semiconductor package includes an integrated circuit mounted on a package substrate. The integrated circuit is electrically connected to the vertical interconnect through the interconnect pad and the lateral interconnect.

In one embodiment, the circuit board further includes a second interconnect pad having a second pad perimeter around a second vertical axis laterally offset from the vertical axis. The lateral interconnect extends from a first end at the pad perimeter to a second end at the second pad perimeter.

In one embodiment, the lateral interconnect includes a radial segment extending radially from the pad perimeter, and a circular segment extending from the radial segment to the second pad perimeter around the pad perimeter at a radius from the vertical axis.

In one embodiment, the lateral interconnect includes a spiral segment between the pad perimeter and the second pad perimeter.

In one embodiment, the spiral segment includes several revolutions around the vertical axis.

In one embodiment, a self-inductance of the lateral interconnect is at least twice a self-inductance of the vertical interconnect when an electrical signal travels through the vertical interconnect and the lateral interconnect.

In an embodiment, a method of fabricating a semiconductor package substrate includes forming a vertical interconnect along a vertical axis through a dielectric layer. The method includes forming an interconnect pad over the dielectric layer at an end of the vertical interconnect. The interconnect pad includes a pad perimeter around the vertical axis. The method includes forming a lateral interconnect extending laterally from the interconnect pad over the dielectric layer. The lateral interconnect includes an arc segment extending around the interconnect pad about the vertical axis.

In one embodiment, the method includes forming a second interconnect pad over the dielectric layer. The second interconnect pad includes a second pad perimeter around a second vertical axis laterally offset from the vertical axis. The lateral interconnect extends from a first end at the pad perimeter to a second end at the second pad perimeter.

In one embodiment, the lateral interconnect includes a radial segment extending radially from the pad perimeter, and a circular segment extending from the radial segment to the second pad perimeter around the pad perimeter at a radius from the vertical axis.

In one embodiment, the lateral interconnect includes a spiral segment between the pad perimeter and the second pad perimeter.

In one embodiment, the spiral segment includes several revolutions around the vertical axis.

What is claimed is:

1. A semiconductor package, comprising:
a package substrate including an interconnect pad having a pad perimeter around a vertical axis, a vertical interconnect extending from the interconnect pad along the vertical axis, and a lateral interconnect extending laterally from the interconnect pad, wherein the lateral interconnect includes an arc segment extending around and encircling at least a portion of the interconnect pad about the vertical axis; and
an integrated circuit mounted on the package substrate, wherein the integrated circuit is electrically connected to the vertical interconnect through the interconnect pad and the lateral interconnect.

2. The semiconductor package of claim 1, wherein the package substrate further includes a second interconnect pad having a second pad perimeter around a second vertical axis laterally offset from the vertical axis, and a second vertical interconnect extending along the second vertical axis from the second interconnect pad, wherein the lateral interconnect extends from a first end at the pad perimeter to a second end at the second pad perimeter.

3. The semiconductor package of claim 2, wherein the vertical interconnect includes a plated-through-hole, and wherein the second vertical interconnect includes a microvia.

4. The semiconductor package of claim 2, wherein the package substrate further includes a reference plane around the interconnect pad and the second interconnect pad, and a dielectric spacer between the reference plane and the interconnect pads, wherein the lateral interconnect extends through the dielectric spacer between the pad perimeter and the second pad perimeter.

5. The semiconductor package of claim 4, wherein the lateral interconnect includes a radial segment extending radially from the pad perimeter, and a circular segment extending from the radial segment to the second pad perimeter around the pad perimeter at a radius from the vertical axis.

6. The semiconductor package of claim 5, wherein a first distance between the pad perimeter and the circular segment is equal to a second distance between the circular segment and the reference plane.

7. The semiconductor package of claim 4, wherein the lateral interconnect includes a spiral segment between the pad perimeter and the second pad perimeter.

8. The semiconductor package of claim 7, wherein the spiral segment includes a plurality of revolutions around the vertical axis.

9. The semiconductor package of claim 1, wherein a self-inductance of the lateral interconnect is at least twice a self-inductance of the vertical interconnect when an electrical signal travels through the vertical interconnect and the lateral interconnect.

10. A semiconductor package assembly, comprising:
a circuit board having an interconnect pad having a pad perimeter around a vertical axis, a vertical interconnect extending from the interconnect pad along the vertical axis, and a lateral interconnect extending laterally from the interconnect pad, wherein the lateral interconnect includes an arc segment extending around and encircling at least a portion of the interconnect pad about the vertical axis; and
a semiconductor package mounted on the circuit board, wherein the semiconductor package includes an integrated circuit mounted on a package substrate, and wherein the integrated circuit is electrically connected to the vertical interconnect through the interconnect pad and the lateral interconnect.

11. The semiconductor package assembly of claim 10, wherein the circuit board further includes a second interconnect pad having a second pad perimeter around a second vertical axis laterally offset from the vertical axis, wherein the lateral interconnect extends from a first end at the pad perimeter to a second end at the second pad perimeter.

12. The semiconductor package assembly of claim 11, wherein the lateral interconnect includes a radial segment extending radially from the pad perimeter, and a circular segment extending from the radial segment to the second pad perimeter around the pad perimeter at a radius from the vertical axis.

13. The semiconductor package assembly of claim 11, wherein the lateral interconnect includes a spiral segment between the pad perimeter and the second pad perimeter.

14. The semiconductor package assembly of claim 13, wherein the spiral segment includes a plurality of revolutions around the vertical axis.

15. The semiconductor package assembly of claim 10, wherein a self-inductance of the lateral interconnect is at least twice a self-inductance of the vertical interconnect when an electrical signal travels through the vertical interconnect and the lateral interconnect.

16. A method, comprising:
forming a vertical interconnect along a vertical axis through a dielectric layer;
forming an interconnect pad over the dielectric layer at an end of the vertical interconnect, wherein the interconnect pad includes a pad perimeter around the vertical axis; and
forming a lateral interconnect extending laterally from the interconnect pad over the dielectric layer, wherein the lateral interconnect includes an arc segment extending around and encircling at least a portion of the interconnect pad about the vertical axis.

17. The method of claim 16, further comprising:
forming a second interconnect pad over the dielectric layer, wherein the second interconnect pad includes a second pad perimeter around a second vertical axis laterally offset from the vertical axis, and wherein the lateral interconnect extends from a first end at the pad perimeter to a second end at the second pad perimeter.

18. The method of claim 17, wherein the lateral interconnect includes a radial segment extending radially from the pad perimeter, and a circular segment extending from the radial segment to the second pad perimeter around the pad perimeter at a radius from the vertical axis.

19. The method of claim 17, wherein the lateral interconnect includes a spiral segment between the pad perimeter and the second pad perimeter.

20. The method of claim 19, wherein the spiral segment includes a plurality of revolutions around the vertical axis.

* * * * *